United States Patent
Jeon et al.

(10) Patent No.: US 12,068,334 B2
(45) Date of Patent: Aug. 20, 2024

(54) DISPLAY DEVICE AND METHOD FOR MANUFACTURING THE SAME

(71) Applicant: Samsung Display Co., LTD., Yongin-si (KR)

(72) Inventors: Kyung Jin Jeon, Incheon (KR); Eok Su Kim, Seoul (KR); Joon Seok Park, Yongin-si (KR); So Young Koo, Yongin-si (KR); Tae Sang Kim, Seoul (KR); Jun Hyung Lim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 58 days.

(21) Appl. No.: 17/039,474

(22) Filed: Sep. 30, 2020

(65) Prior Publication Data
US 2021/0134851 A1   May 6, 2021

(30) Foreign Application Priority Data
Nov. 6, 2019   (KR) .......................... 10-2019-0140910

(51) Int. Cl.
*H01L 27/12*   (2006.01)

(52) U.S. Cl.
CPC ...... *H01L 27/1255* (2013.01); *H01L 27/1288* (2013.01); *H01L 27/1225* (2013.01); *H01L 27/124* (2013.01)

(58) Field of Classification Search
CPC ............. H01L 27/1255; H01L 27/1288; H01L 27/1225; H01L 27/124
See application file for complete search history.

(56) References Cited

U.S. PATENT DOCUMENTS

| | | | |
|---|---|---|---|
| 2003/0038241 A1* | 2/2003 | Choo | H01L 27/1214 257/E27.111 |
| 2013/0122682 A1* | 5/2013 | Deweerd | H01L 28/60 257/E21.011 |
| 2013/0140635 A1* | 6/2013 | Yan | H01L 27/1255 257/E21.409 |
| 2014/0339515 A1* | 11/2014 | Mo | H10K 59/123 438/34 |
| 2015/0179724 A1* | 6/2015 | Lee | H01L 29/7869 438/23 |
| 2015/0214248 A1* | 7/2015 | Chou | H01L 29/66969 438/23 |
| 2016/0372497 A1* | 12/2016 | Lee | H01L 27/1255 |

FOREIGN PATENT DOCUMENTS

| | | |
|---|---|---|
| KR | 10-2014-0120542 | 10/2014 |
| KR | 10-2017-0078075 | 7/2017 |
| KR | 10-2017-0143082 | 12/2017 |
| KR | 10-2018-0061723 | 6/2018 |

\* cited by examiner

*Primary Examiner* — Trang Q Tran
(74) *Attorney, Agent, or Firm* — Lewis Roca Rothgerber Christie LLP

(57) ABSTRACT

According to some embodiments of the present disclosure, a display device includes an active pattern including a metal oxide, a gate electrode overlapping the active pattern, a first capacitor electrode spaced apart from the active pattern and including a conductive oxide, and a second capacitor electrode on the first capacitor electrode.

12 Claims, 8 Drawing Sheets

DISPLAY DEVICE AND METHOD FOR MANUFACTURING THE SAME

CROSS-REFERENCE TO RELATED APPLICATION

This application claims priority to and the benefit of Korean Patent Application No. 10-2019-0140910 filed on Nov. 6, 2019 in the Korean Intellectual Property Office, the entire disclosure of which is incorporated herein by reference.

BACKGROUND

1. Field

Embodiments relate to a display device. More particularly, embodiments relate to a display device and a method of manufacturing the display device.

2. Description of the Related Art

A display device includes a pixel array. The pixel array may include a light-emitting element such as an organic light-emitting diode, and a driving element for driving the light-emitting element.

The driving element includes at least one transistor and may include a storage capacitor, for example, to maintain a voltage applied to the light-emitting element.

SUMMARY

Aspects of embodiments are directed toward a display device having improved efficiency.

Aspects of embodiments are directed toward a method for manufacturing the display device.

According to an embodiment, a display device includes an active pattern including a metal oxide, a gate electrode overlapping the active pattern, a first capacitor electrode spaced apart from the active pattern and including a conductive oxide, and a second capacitor electrode on the first capacitor electrode.

In an embodiment, the metal oxide includes tin.

In an embodiment, the metal oxide includes tin and gallium.

In an embodiment, the metal oxide includes at least one selected from among the group consisting of indium tin gallium oxide, indium tin gallium zinc oxide, and tin aluminum gallium oxide.

In an embodiment, the conductive oxide includes indium and tin.

In an embodiment, the conductive oxide is crystalline.

In an embodiment, the display device further includes a dummy semiconductor pattern under the first capacitor electrode and spaced apart from the active pattern.

In an embodiment, the display device further includes a gate insulation pattern between the active pattern and the gate electrode, and a dielectric pattern disposed between the first capacitor electrode and the second capacitor electrode and formed from a same layer as the gate insulation pattern.

In an embodiment, the display device further includes a connection line to transfer a constant voltage to the first capacitor electrode.

In an embodiment, the connection line extends over the second capacitor electrode to form a third capacitor electrode overlapping the second capacitor electrode.

In an embodiment, the second capacitor electrode is electrically connected to the gate electrode.

In an embodiment, the second capacitor electrode and the gate electrode are in a same pattern.

According to an embodiment, a method for manufacturing a display device is provided. An oxide semiconductor layer is formed. A conductive oxide layer is formed on the oxide semiconductor layer. A first photoresist pattern and a second photoresist pattern are formed on the conductive oxide layer. The second photoresist pattern has a thickness greater than the first photoresist pattern. The conductive oxide layer and the oxide semiconductor layer are etched to form a first semiconductor pattern under the first photoresist pattern, a first conductive pattern between the first semiconductor pattern and the first photoresist pattern, a second semiconductor pattern disposed under the second photoresist pattern, and a second conductive pattern between the second semiconductor pattern and the second photoresist pattern. An entire portion of the first photoresist pattern and a portion of the second photoresist pattern are removed. The first conductive pattern is selectively removed by utilizing a remaining portion of the second photoresist pattern as a mask. An insulation layer is formed to cover the first semiconductor pattern and the second conductive pattern. A gate pattern is formed. The gate pattern includes a gate electrode, which overlaps the first semiconductor pattern, and a capacitor electrode, which overlaps the second conductive pattern.

In an embodiment, the oxide semiconductor layer includes tin and gallium.

In an embodiment, the conductive oxide layer includes indium and tin.

In an embodiment, the conductive oxide layer and the oxide semiconductor layer are etched by an etching composition including sodium persulfate.

In an embodiment, the first conductive pattern is selectively removed by an etching composition including sulfuric acid and nitric acid.

In an embodiment, the second conductive pattern is crystallized through an annealing process.

In an embodiment, the insulation layer is etched by utilizing the gate pattern as a mask to form a gate insulation pattern, which is between the first semiconductor pattern and the gate electrode, and a dielectric pattern, which is between the second conductive pattern and the capacitor electrode.

In an embodiment, a source metal pattern including a connection line and a drain electrode is formed. The connection line electrically contacts the second conductive pattern, and the drain electrode electrically contacts the first semiconductor pattern.

According to embodiments of the present disclosure, a capacitor electrode may be formed from a conductive oxide. The capacitor electrode may be formed in the process of forming an active pattern.

Thus, a metal layer and an insulation layer for forming a capacitor electrode in a conventional method may be omitted. Thus, a manufacturing efficiency may be improved.

BRIEF DESCRIPTION OF THE DRAWINGS

Aspects of one or more embodiments of the present disclosure will be more clearly understood from the following detailed description taken in conjunction with the accompanying drawings.

DETAILED DESCRIPTION

Figure 1:
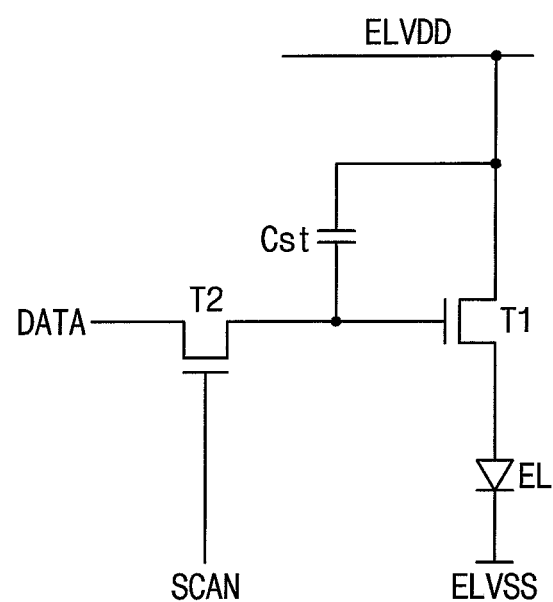
FIG. 1 is a circuit diagram of a pixel unit of a display device according to an embodiment.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

As used herein, the singular forms "a", "an" and "the" are intended to include the plural forms as well, unless the context clearly indicates otherwise. It will be further understood that the terms "comprises," "comprising," "includes," and "including," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Further, the use of "may" when describing embodiments of the present disclosure refers to "one or more embodiments of the present disclosure." It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present.

As used herein, the term "substantially," "about," and similar terms are used as terms of approximation and not as terms of degree, and are intended to account for the inherent deviations in measured or calculated values that would be recognized by those of ordinary skill in the art.

A display device and a method for manufacturing a display device according to embodiments of the present disclosure will be described hereinafter with reference to the accompanying drawings, in which some embodiments are shown. Same or similar reference numerals may be used for same or similar elements in the drawings.

Figure 2:
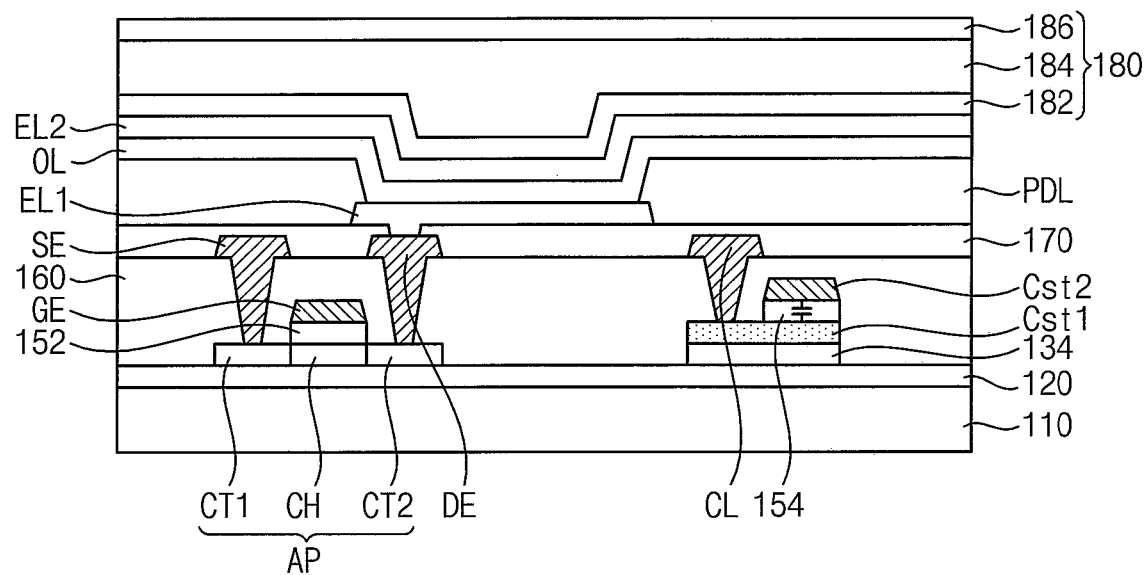
FIG. 2 is a cross-sectional view illustrating a display device according to an embodiment.
Figure 3:
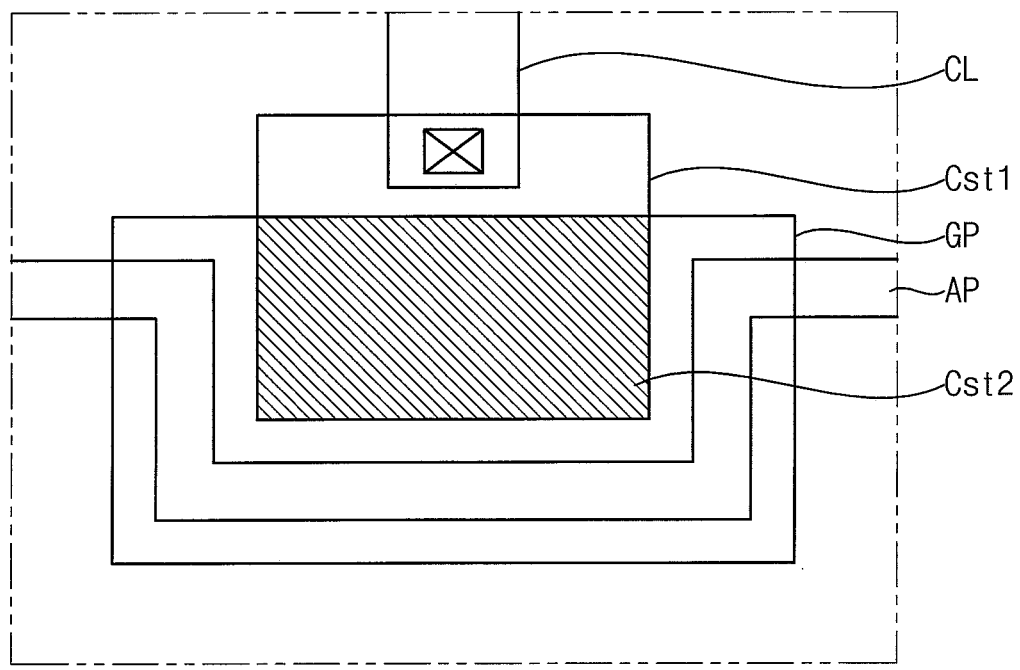
FIG. 3 is a plan view illustrating a display device according to an embodiment.

FIG. 1 is a circuit diagram of a pixel unit of a display device according to an embodiment. FIG. 2 is a cross-sectional view illustrating a display device according to an embodiment. FIG. 3 is a plan view illustrating a display device according to an embodiment.

A display device according to an embodiment includes a pixel array. Each of pixel units may include a light-emitting element and a driving element for driving the light-emitting element. The driving element may include at least one transistor and a storage capacitor.

For example, referring to FIG. 1, a pixel unit includes a first transistor T1, a second transistor T2, a storage capacitor Cst and a light-emitting element EL. For example, the first transistor T1 may be a driving transistor for providing a driving current to the light-emitting element EL. The second transistor T2 may be a switching transistor for driving and/or activating (e.g., switching on) the driving transistor.

A first power voltage ELVDD may be applied to a source electrode of the first transistor T1. A gate electrode of the first transistor T1 may be electrically connected to a drain electrode of the second transistor T2. A data signal DATA may be applied to a source electrode of the second transistor T2. When a scan signal SCAN is applied to a gate electrode of the second transistor T2, the second transistor T2 is turned on so that a gate voltage from the data signal DATA may be applied to the gate electrode of the first transistor T1 (e.g., so that the data signal DATA may be applied to the gate electrode of the first transistor T1).

When the first transistor T1 is turned on, the first power voltage ELVDD is applied to a first electrode of the light-emitting element EL. A driving current is provided to the light-emitting element EL depending on a difference between the first power voltage ELVDD and a second power voltage ELVSS applied to a second electrode of the light-emitting element EL.

The storage capacitor Cst may function to maintain the gate voltage applied to the first transistor T1 (e.g., to the gate electrode of the first transistor T1).

Referring to FIG. 2, a display device may include an active pattern AP including a channel area CH, a gate electrode GE overlapping the active pattern AP, a first capacitor electrode Cst1 and a second capacitor electrode Cst2 overlapping the first capacitor electrode Cst1. The gate electrode GE may correspond to the gate electrode of the first transistor T1 illustrated in FIG. 1.

In an embodiment, the active pattern AP includes (e.g., is) a metal oxide. The first capacitor electrode Cst1 includes (e.g., is) a conductive oxide. A dummy semiconductor pattern 134 including (e.g., being) an oxide semiconductor may be disposed under the first capacitor electrode Cst1.

The second capacitor electrode Cst2 is disposed on the first capacitor electrode Cst1. The second capacitor electrode Cst2 may be formed from a same layer as the gate electrode GE. For example, in an embodiment, the second capacitor electrode Cst2 may include (e.g., be) the same material as the gate electrode GE, and the second capacitor electrode Cst2 may be patterned from the same layer from which the gate electrode GE is patterned. A dielectric pattern 154 may be disposed between the first capacitor electrode Cst1 and the second capacitor electrode Cst2. The dielectric pattern 154 may be formed from a same layer as a gate insulation pattern 152 disposed between the active pattern AP and the gate electrode GE. For example, in an embodiment, the dielectric pattern 154 may include (e.g., be) the same material as the gate insulation pattern 152, and the dielectric pattern 154 may be patterned from the same layer from which the gate insulation pattern 152 is patterned.

In an embodiment, a constant voltage (e.g., a voltage with a constant magnitude) may be applied to the first capacitor electrode Cst1. For example, the first power voltage ELVDD illustrated in FIG. 1 may be applied to the first capacitor electrode Cst1. The display device may further include a connection line CL to transfer the first power voltage ELVDD to the first capacitor electrode Cst1. For example, the connection line CL may be a portion of a power wiring to transfer the first power voltage ELVDD, or the connection line CL may be a portion of a source wiring including a source electrode SE. For example, in an embodiment, the source wiring may include a first portion that is the source electrode SE and a second portion that is the connection line CL.

In an embodiment, the second capacitor electrode Cst2 may be electrically connected to the gate electrode GE.

Thus, a storage capacitor Cst may be defined by the first capacitor electrode Cst1 and the second capacitor electrode Cst2.

FIG. 3 may illustrate an enlarged area, where the storage capacitor is formed, in a display device according to an embodiment.

Referring to FIGS. 2 and 3, a gate pattern GP overlaps an active pattern AP. A portion of the gate pattern GP, which overlaps the active pattern AP, may correspond to the gate electrode GE. A portion of the active pattern AP, which overlaps the gate electrode GE, may correspond to a channel area CH. In an embodiment, the active pattern AP may have a bending shape to increase a length of the channel area CH.

In a plan view, the first capacitor electrode Cst1 is spaced apart from the active pattern AP. Furthermore, a dummy semiconductor pattern 134 disposed under the first capacitor electrode Cst1 is spaced apart from the active pattern AP.

A portion of the gate pattern GP overlaps the first capacitor electrode Cst1. The portion of the gate pattern GP overlapping the first capacitor electrode Cst1 may define a second capacitor electrode Cst2.

A power voltage may be applied to the first capacitor electrode Cst1 through a connection line CL. In an embodiment, the connection line CL may be electrically connected to the first capacitor electrode Cst1 through a via hole (e.g., contact hole) penetrating through an interlayer insulation layer 160 to expose the first capacitor electrode Cst1.

In an embodiment, a pixel unit of a display device may include two transistors and one capacitor. However, embodiments are not limited thereto. For example, embodiments may have various suitable circuit configurations, for example, 7T1C or the like.

FIGS. 4 to 11 are cross-sectional views illustrating a method for manufacturing a display device according to an embodiment.

Figure 4:
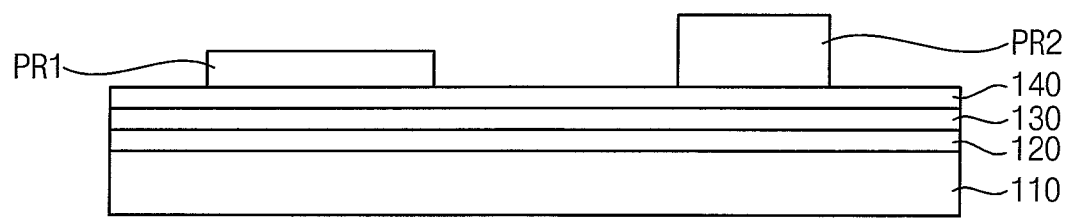
FIGS. 4 to 11 are cross-sectional views illustrating a method for manufacturing a display device according to an embodiment.

Referring to FIG. 4, a buffer layer 120 is formed on a base substrate 110. The buffer layer 120 may prevent or reduce penetration of impurities, humidity and/or external gas from underneath of the base substrate 110, and the buffer layer 120 may planarize an upper surface of the base substrate 110. For example, the buffer layer 120 may include (e.g., be) an inorganic material such as oxide, nitride and/or the like. In an embodiment, the buffer layer 120 may have a multiple-layered structure including a lower layer including (e.g., being) silicon nitride and an upper layer including (e.g., being) silicon oxide.

An oxide semiconductor layer 130 is formed on the buffer layer 120. The oxide semiconductor layer 130 may include (e.g., be) a metal oxide. In an embodiment, the oxide semiconductor layer 130 may include (e.g., be) at least tin (Sn). In an embodiment, the oxide semiconductor layer 130 may include (e.g., be) tin and gallium (Ga). For example, the oxide semiconductor layer 130 may include (e.g., be) indium tin gallium oxide, indium tin gallium zinc oxide, tin aluminum gallium oxide and/or the like. In an embodiment, the oxide semiconductor layer 130 may include (e.g., be) indium tin aluminum oxide.

A conductive oxide layer 140 is formed on the oxide semiconductor layer 130. In an embodiment, the conductive oxide layer 140 may include (e.g., be) at least tin. For example, the conductive oxide layer 140 may include (e.g., be) indium and tin. In an embodiment, the conductive oxide layer 140 may include (e.g., be) amorphous indium tin oxide.

A first photoresist pattern PR1 and a second photoresist pattern PR2 are formed on the conductive oxide layer 140. The second photoresist pattern PR2 may have a thickness larger (e.g., greater) than the first photoresist pattern PR1. The photoresist patterns PR1 and PR2, which may have different thicknesses, may be formed by half-tone light exposure.

Figure 5:
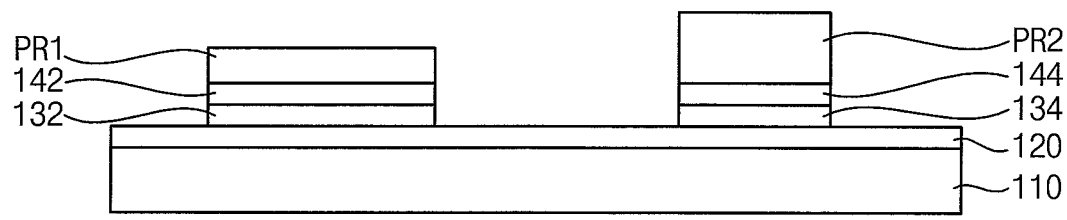

Referring to FIG. 5, the conductive oxide layer 140 and the oxide semiconductor layer 130 are etched by utilizing the photoresist patterns as a mask. In an embodiment, the conductive oxide layer 140 and the oxide semiconductor layer 130 may be etched by a same etching composition. As disclosed herein, an "etching composition" may, for example, refer to an etchant. For example, an etching composition including (e.g., being) sodium persulfate may be utilized for integrally etching the conductive oxide layer 140 and the oxide semiconductor layer 130. However, embodiments are not limited thereto. For example, the conductive oxide layer 140 and the oxide semiconductor layer 130 may be etched by different etching compositions.

As a result, a first semiconductor pattern 132, a second semiconductor pattern 134 spaced apart from the first semiconductor pattern 132, a first conductive pattern 142 disposed on the first semiconductor pattern 132 and a second conductive pattern 144 disposed on the second semiconductor pattern 134. The semiconductor pattern 134 may be referred as a dummy semiconductor pattern.

Figure 6:
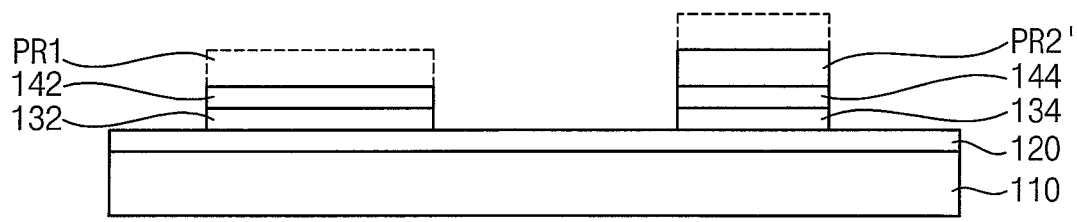

Referring to FIG. 6, the first photoresist pattern PR1 is etched, for example, by an ashing process. The second photoresist pattern PR2 is partially etched to form a remaining photoresist pattern PR2'.

Figure 7:
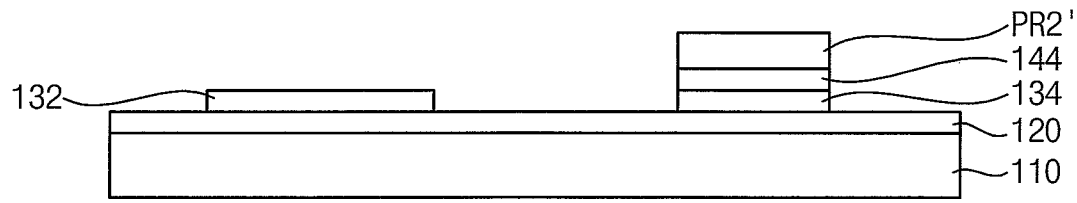

Referring to FIG. 7, an etching composition is provided to remove the first conductive pattern 142. For example, an etching composition including (e.g., being) a sulfuric acid and/or a nitric acid may be utilized for removing the first conductive pattern 142. When the first conductive pattern 142 is removed, the first semiconductor pattern 132 may remain because of differences in etching rates between the first conductive pattern 142 and the first semiconductor pattern 132. For example, in an embodiment, the first conductive pattern 142 and the first semiconductor pattern 132 may have a high selectivity so that the first conductive pattern 142 is removed while all or substantially all of the first semiconductor pattern 132 remains. The etching composition may be properly selected from generally available etching compositions in view of differences in etching rates between the conductive oxide layer and the metal oxide of the oxide semiconductor layer depending on materials thereof. In an embodiment, the remaining photoresist pattern PR2' may then be removed by any suitable process, such as by etching, for example, by an ashing process.

Figure 8:
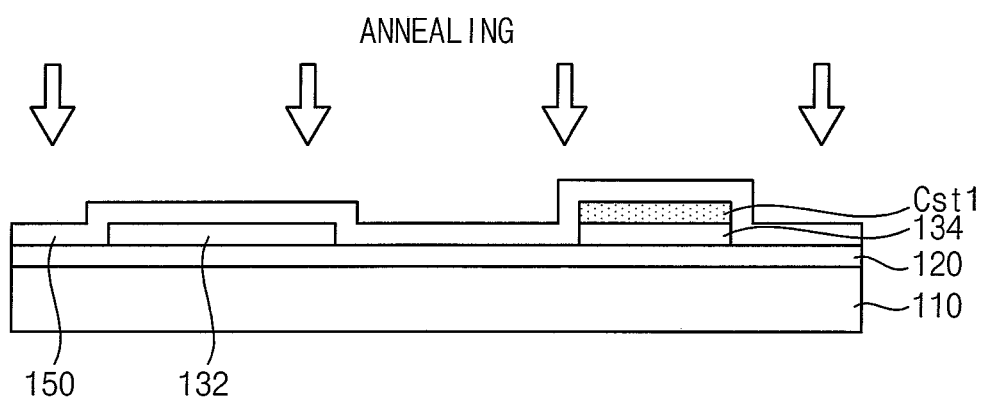

Referring to FIG. 8, a preliminary insulation layer 150 is formed to cover the first semiconductor pattern 132 and the second conductive pattern 144.

In an embodiment, the preliminary insulation layer 150 may include (e.g., be) silicon oxide, silicon nitride, silicon carbide and/or a combination thereof. Furthermore, the preliminary insulation layer 150 may include (e.g., be) or further include (e.g., be) an insulating metal oxide such as aluminum oxide, tantalum oxide, hafnium oxide, zirconium oxide, titanium oxide and/or the like. In an embodiment, the preliminary insulation layer 150 may include (e.g., be) silicon oxide.

Thereafter, an annealing process ANNEALING is performed. Electric characteristics of the first semiconductor pattern 132 may be improved through the annealing process. Furthermore, the second conductive pattern 144 may be crystallized through the annealing process. For example, amorphous indium-tin oxide of the second conductive pattern 144 may be changed to crystalline indium-tin-oxide. The second conductive pattern, after being crystallized, may be referred to as a first capacitor electrode Cst1. In an embodiment, the annealing process may be performed at equal to or more than 200° C.

In another embodiment, the annealing process may be performed before the preliminary insulation layer 150 is formed.

Figure 9:
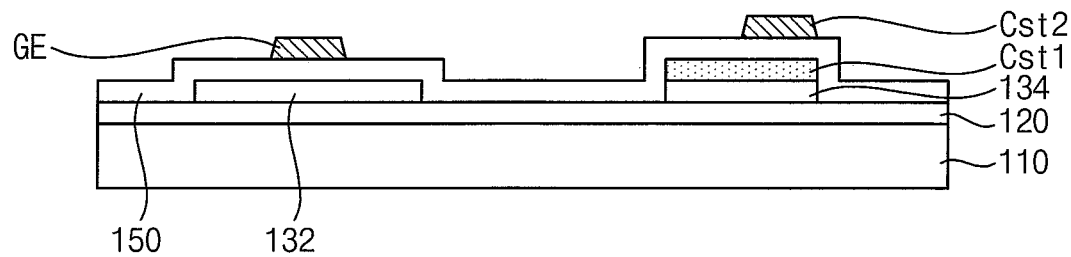

Referring to FIG. 9, a gate metal layer is formed on the preliminary insulation layer 150 and patterned to form a gate pattern. The gate pattern may include a gate electrode GE, which overlaps the first semiconductor pattern 132, and a second capacitor electrode Cst2, which overlaps the first capacitor electrode Cst1.

The gate metal layer may include (e.g., be) a metal, a metal alloy, a metal nitride, a conductive metal oxide and/or the like. For example, the gate metal layer may include (e.g., be) gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) and/or an alloy thereof, and may have a single-layered structure or a multiple-layered structure including different metal layers.

Referring to FIG. 9, the gate electrode GE may be spaced apart from the second capacitor electrode Cst2. However, embodiments are not limited thereto. For example, the gate electrode GE and the second capacitor electrode Cst2 may be connected (e.g., continuously connected, physically connected, and/or electrically connected) to each other to be disposed in a single pattern. For example, the gate electrode GE may be included in the same pattern as that of the second capacitor electrode Cst2.

Figure 10:
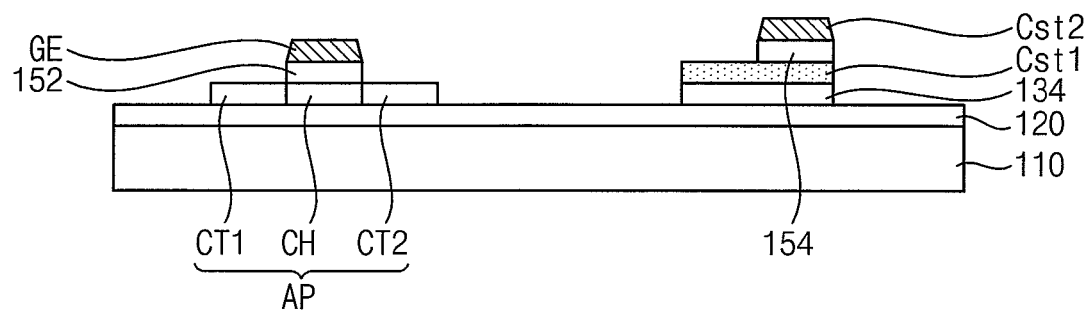

Referring to FIG. 10, the preliminary insulation layer 150 is partially removed by utilizing the gate pattern as a mask. Thus, a gate insulation pattern 152, which is disposed between the gate electrode GE and the first semiconductor pattern 132, and a dielectric pattern 154, which is disposed between the first capacitor electrode Cst1 and the second capacitor electrode Cst2, may be formed.

When the preliminary insulation layer 150 is patterned, at least a portion of the buffer layer 120 may be removed as well.

During the process of partially removing the preliminary insulation layer 150 or during an individual (e.g., separate) process, a contact area may be formed from the first semiconductor pattern. For example, after the preliminary insulation layer 150 is patterned, a first contact area CT1 and a second contact area CT2 may be formed from an exposed portion of the first semiconductor pattern. For example, a metal component may be reduced (e.g., partially removed) in the exposed portion of the first semiconductor pattern in a dry-etching process for patterning the preliminary insulation layer 150 so that the exposed portion of the first semiconductor pattern may have an increased conductivity, thereby forming the first contact area CT1 and the second contact area CT2.

A portion between the first contact area CT1 and the second contact area CT2 may define a channel area CH. A metal oxide pattern including the first contact area CT1, the second contact area CT2 and the channel area CH may define an active pattern AP.

Figure 11:
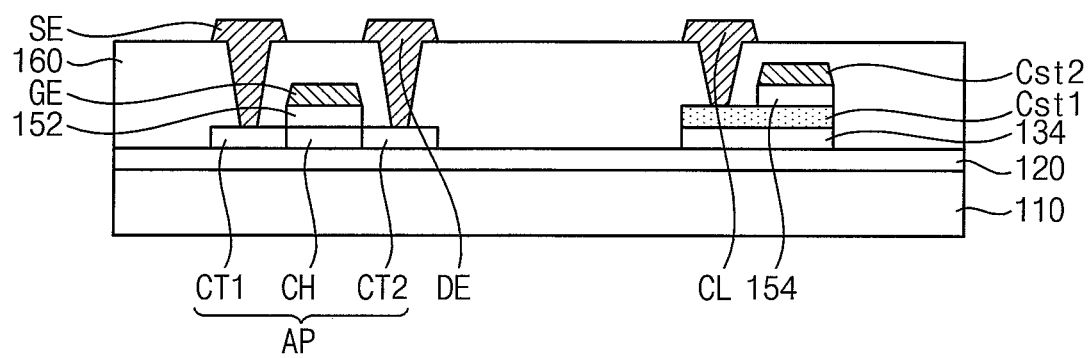

Referring to FIG. 11, an interlayer insulation layer 160 is formed to cover the gate electrode GE and the second capacitor pattern Cst2.

The interlayer insulation layer 160 may include (e.g., be) silicon oxide, silicon nitride, silicon carbide and/or a combination thereof. Furthermore, the interlayer insulation layer 160 may include (e.g., be) or further include (e.g., be) an insulating metal oxide such as aluminum oxide, tantalum oxide, hafnium oxide, zirconium oxide, titanium oxide and/or the like.

The interlayer insulation layer 160 may include via holes (e.g., contact holes) exposing the active pattern AP and the first capacitor electrode Cst1.

A source metal layer is formed on the interlayer insulation layer 160 and patterned to form a source metal pattern.

The source metal layer may include (e.g., be) a metal, a metal alloy, a metal nitride, a conductive metal oxide and/or the like. For example, the source metal layer may include (e.g., be) gold, silver, aluminum, copper, nickel, platinum, magnesium, chromium, tungsten, molybdenum, titanium, tantalum and/or an alloy thereof, and may have a single-layered structure or a multiple-layered structure including different metal layers.

For example, the source metal pattern may include a source electrode SE electrically contacting the active pattern AP (e.g., electrically contacting the first contact area CT1), a drain electrode DE electrically contacting the active pattern (e.g., electrically contacting the second contact area CT2) and spaced apart from the source electrode SE, and a connection line CL electrically contacting the capacitor electrode Cst1.

Thereafter, a via insulation layer 170 is formed to cover the source metal pattern, as illustrated in FIG. 2.

The via insulation layer 170 may include (e.g., be) an organic insulation material such as a phenol resin, an acryl resin, a polyimide resin, a polyamide resin, a siloxane resin, an epoxy resin and/or the like. The via insulation layer 170 may have a substantially flat upper surface to planarize an upper surface of the substrate. In an embodiment, the via insulation layer 170 planarizes the layers and/or components thereunder to provide a flat surface (e.g., the upper surface of the via insulation layer 170).

A first electrode EL1 of an organic light-emitting diode is formed on the via insulation layer 170. The first electrode EL1 may pass through the via insulation layer 170 to electrically contact the drain electrode DE. For example, the first electrode EU may pass through a via hole (e.g., a contact hole) in the via insulation layer 170 to electrically contact the drain electrode DE. In another embodiment, a display device may further include a connection electrode electrically connecting the drain electrode DE to the first electrode EL1.

In an embodiment, the first electrode EU may function as an anode. For example, the first electrode EL1 may be formed as a transmitting electrode or a reflecting electrode according to an emission type or kind of the display device. When the first electrode EL1 is a transmitting electrode, the first electrode EU may include (e.g., be) indium tin oxide, indium zinc oxide, zinc tin oxide, indium oxide, zinc oxide, tin oxide and/or the like. When the first electrode EU is a reflecting electrode, the first electrode EL1 may include (e.g., be) gold, silver, aluminum, copper, nickel, platinum, magnesium, chromium, tungsten, molybdenum, titanium and/or a combination thereof, and may have a stacked structure further including the material that may be utilized for, or included in, the transmitting electrode. For example, in an embodiment, the first electrode may have a stacked structure having a lower layer including gold, silver, aluminum, copper, nickel, platinum, magnesium, chromium, tungsten, molybdenum, titanium and/or a combination thereof, and an upper layer including a material that may be included in the transmitting electrode.

A pixel-defining layer PDL may be formed on the via insulation layer 170. The pixel-defining layer PDL may include an opening that exposes at least a portion of the first electrode EL1. In an embodiment, the pixel-defining layer PDL may include (e.g., be) an organic insulation material.

An organic light-emitting layer OL is formed on the first electrode EL1. The organic light-emitting layer OL may include at least a light-emitting layer and may further include at least one selected from among a hole injection layer (HIL), a hole transporting layer (HTL), an electron transporting layer (ETL) and an electron injection layer (EIL). For example, the organic light-emitting layer OL may include (e.g., be) a low molecular weight organic compound or a high molecular weight organic compound.

In an embodiment, the organic light-emitting layer OL may emit a red light, a green light or a blue light. In another embodiment, the organic light-emitting layer OL may emit a white light. When the organic light-emitting layer OL emits a white light, the organic light-emitting layer OL may have a multiple-layer structure including a red-emitting layer, a green-emitting layer and a blue-emitting layer, or a single-layer structure including (e.g., being) a mixture of a red-emitting material, a green-emitting material and a blue-emitting material.

In an embodiment, the organic light-emitting layer OL may be formed by a screen printing method, an inkjet printing method, an evaporation deposition method and/or the like.

A second electrode EL2 is formed on the organic light-emitting layer OL. In an embodiment, the second electrode EL2 may function as a cathode. For example, the second electrode EL2 may be formed as a transmitting electrode or a reflecting electrode according to an emission type or kind of the display device. For example, the second electrode EL2 may include (e.g., be) a metal, a metal alloy, a metal nitride, a metal fluoride, a conductive metal oxide and/or a combination thereof.

In an embodiment, the second electrode EL2 may extend continuously across a plurality of pixels in a display area. For example, the second electrode EL2 may be a common electrode.

An encapsulation layer 180 may be formed on the organic light-emitting diode. The encapsulation layer 180 may have a stacked structure of inorganic thin films 182 and 186 and an organic thin film 184. For example, a first inorganic thin film 182, the organic thin film 184, and a second inorganic thin film 186 may be stacked in this order. In an embodiment, the organic thin film 184 may include (e.g., be) a cured polymer resin such as polyacrylate, polymethacrylate and/or the like. For example, the cured polymer resin may be formed by cross-linking reaction of monomers.

In an embodiment, the inorganic thin films 182 and 186 may include (e.g., be) silicon oxide, silicon nitride, silicon carbide and/or a combination thereof.

In an embodiment, a capacitor electrode may be formed from a conductive oxide. The capacitor electrode may be formed in the process of forming an active pattern.

Thus, a metal layer and an insulation layer for forming a capacitor electrode in a conventional method may be omitted. Thus, a manufacturing efficiency may be improved.

Figure 12:
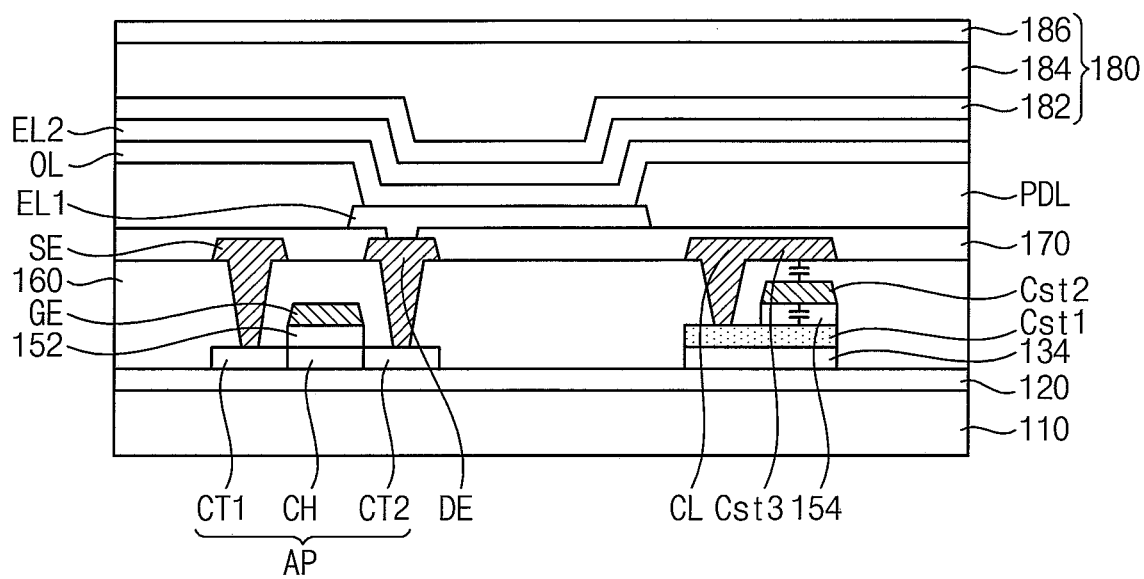
FIG. 12 is a cross-sectional view illustrating a display device according to an embodiment.
Figure 13:
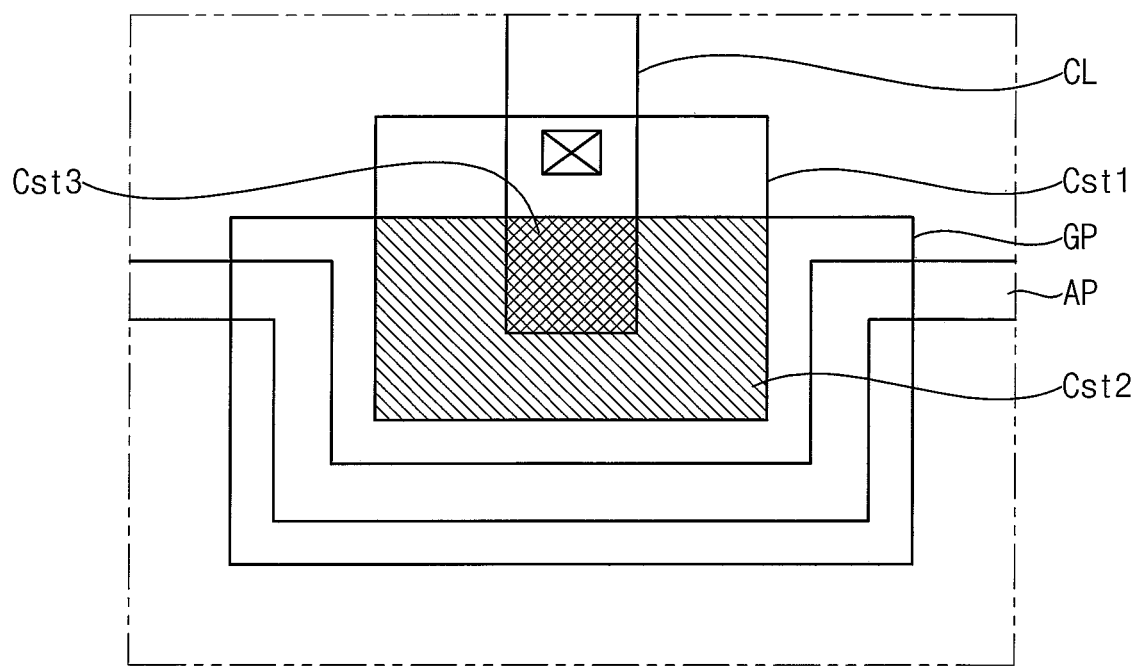
FIG. 13 is a plan view illustrating a display device according to an embodiment.

FIG. 12 is a cross-sectional view illustrating a display device according to an embodiment. FIG. 13 is a plan view illustrating a display device according to an embodiment.

Referring to FIGS. 12 and 13, a display device may include an active pattern AP including a channel area CH, a gate electrode GE overlapping the active pattern AP, a first capacitor electrode Cst1, and a second capacitor electrode Cst2 overlapping the first capacitor electrode Cst1.

In an embodiment, the active pattern AP includes (e.g., is) a metal oxide. The first capacitor electrode Cst1 includes (e.g., is) a conductive oxide. A dummy semiconductor pattern 134 including (e.g., being) an oxide semiconductor may be disposed under the first capacitor electrode Cst1.

The second capacitor electrode Cst2 is disposed on the first capacitor electrode Cst1. The second capacitor electrode Cst2 may be formed from a same layer as the gate electrode GE. For example, in an embodiment, the second capacitor electrode Cst2 may include (e.g., be) the same material as the gate electrode GE, and the second capacitor electrode Cst2 may be patterned from the same layer from which the gate electrode GE is patterned. A dielectric pattern 154 may be disposed between the first capacitor electrode Cst1 and the second capacitor electrode Cst2. The dielectric pattern 154 may be formed from a same layer as a gate insulation pattern 152 disposed between the active pattern AP and the gate electrode GE. For example, in an embodiment, the dielectric pattern 154 may include (e.g., be) the same material as the gate insulation pattern 152, and the dielectric pattern 154 may be patterned from the same layer from which the gate insulation pattern 152 is patterned.

In an embodiment, a constant voltage (e.g., a voltage with a constant magnitude) may be applied to the first capacitor electrode Cst1. For example, the first power voltage ELVDD illustrated in FIG. 1 may be applied to the first capacitor electrode Cst1. The display device may further include a connection line CL to transfer the first power voltage ELVDD to the first capacitor electrode Cst1. The connection line CL may be electrically connected to the first capacitor electrode Cst1 through a via hole (e.g., contact hole) penetrating through an interlayer insulation layer 160.

In an embodiment, the second capacitor electrode Cst2 may be electrically connected to the gate electrode GE.

In an embodiment, the connection line CL may extend over (e.g., overlap) the second capacitor electrode Cst2. A portion of the connection line CL, which overlaps the second capacitor electrode Cst2, may define a third capacitor electrode Cst3.

Thus, a storage capacitor may be defined by a first storage capacitor, which is formed by the first capacitor electrode Cst1 and the second capacitor electrode Cst2, and a second storage capacitor, which is formed by the third capacitor electrode Cst3 and the second capacitor electrode Cst2. For example, an entire capacitance of the storage capacitor may be defined by the sum of capacitances of the first storage capacitor and the second storage capacitor.

Figure 14:
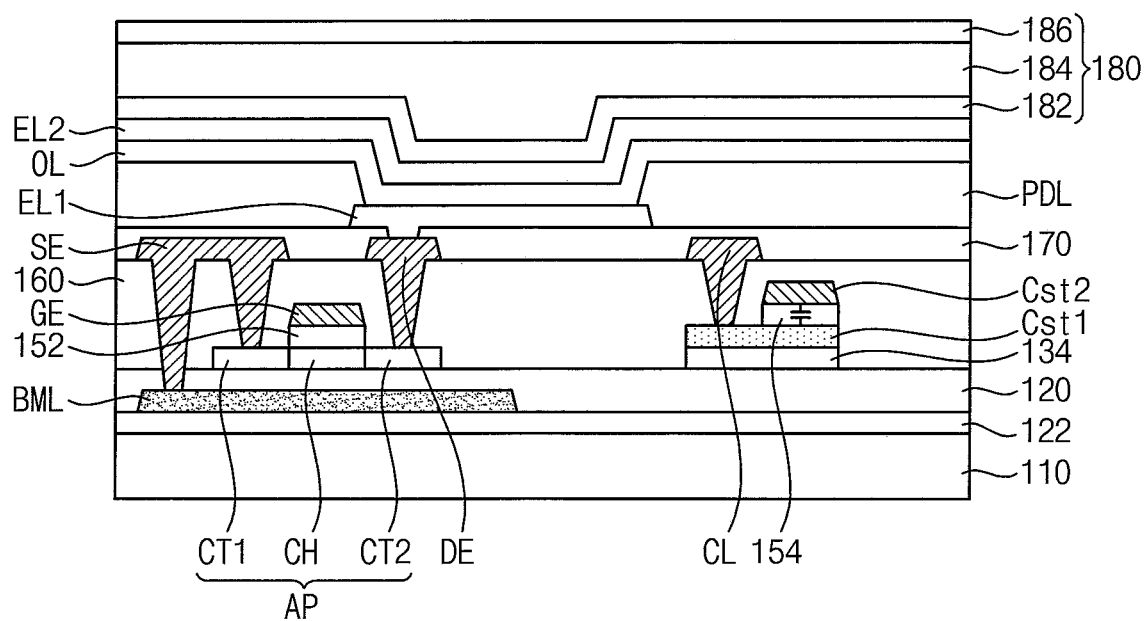
FIG. 14 is a cross-sectional view illustrating a display device according to an embodiment.

FIG. 14 is a cross-sectional view illustrating a display device according to an embodiment.

Referring to FIG. 14, a display device may further include a bottom metal pattern BML disposed under an active pattern AP. A barrier layer 122 may be disposed between the bottom metal pattern BML and a base substrate 110, and a buffer layer 120 may be disposed between the bottom metal pattern BML and the active pattern AP.

The bottom metal pattern BML may include (e.g., be) a metal, a metal alloy, a metal nitride, a conductive metal oxide and/or the like. For example, the bottom metal pattern BML may include (e.g., be) gold, silver, aluminum, copper, nickel, platinum, magnesium, chromium, tungsten, molybdenum, titanium, tantalum and/or an alloy thereof, and may have a single-layered structure or a multiple-layered structure including different metal layers.

The bottom metal pattern BML may prevent or block light from entering (e.g., from being incident onto) the active pattern AP from the base substrate 110 (e.g., from below the base substrate 110) to prevent or reduce deterioration of electrical characteristics of the active pattern AP.

In an embodiment, a constant voltage (e.g., a voltage with a constant magnitude) may be applied to the bottom metal pattern BML. For example, the bottom metal pattern BML may electrically contact the source electrode SE to receive the constant voltage. In another embodiment, the bottom metal pattern BML may be utilized for a power voltage wiring or a signal wiring.

In an embodiment, the barrier layer 122 may include (e.g., be) an inorganic material such as silicon oxide, silicon nitride and/or the like.

Embodiments may be applied to various suitable display devices utilizing a metal oxide semiconductor, such as a liquid crystal display device, as well as an organic light-emitting display device.

For example, embodiments may be applied to vehicle-display devices, a ship-display device, an aircraft-display device, portable communication devices, display devices for display or for information transfer, a medical-display device, etc. Furthermore, embodiments may be applied to various suitable electronic devices utilizing a metal oxide semiconductor besides a display device The foregoing is illustrative of some embodiments and is not to be construed to limit the present disclosure. Although some embodiments have been described, those skilled in the art will readily appreciate that many modifications are possible without materially departing from the spirit and scope of the present disclosure. Accordingly, all such modifications are intended to be included within the scope of the present disclosure. Therefore, it is to be understood that the foregoing is illustrative of some embodiments of the present disclosure and is not to be construed as limiting the present disclosure to the disclosed embodiments, and that modifications to the disclosed embodiments, as well as other embodiments, are intended to be included within the scope of the present disclosure, as set forth in the following claims and equivalents thereof.

What is claimed is:

1. A display device comprising:
an active pattern disposed on a base substrate and including a metal oxide;
a gate electrode overlapping the active pattern;
a first capacitor electrode including a conductive oxide;
a dummy semiconductor pattern between the first capacitor electrode and a planarized upper surface of the base substrate that faces the dummy semiconductor pattern and having a conductivity different from a conductivity of the first capacitor electrode, wherein an entire portion of a lower surface of the first capacitor electrode directly contacts an upper surface of the dummy semiconductor pattern without an intervening layer between the entire portion of the lower surface of the first capacitor electrode and the upper surface of the dummy semiconductor pattern;
an insulation layer disposed on the active pattern and the dummy semiconductor pattern, the insulation layer directly contacting a side surface of the active pattern and a side surface of the dummy semiconductor pattern; and
a second capacitor electrode on the first capacitor electrode, the first capacitor electrode being between the dummy semiconductor pattern and the second capacitor electrode,
wherein a thickness between a lower surface and the upper surface of the dummy semiconductor pattern is at least as great as a thickness between a lower surface and the upper surface of the active pattern.

2. The display device of claim 1, wherein the metal oxide includes tin.

3. The display device of claim 2, wherein the metal oxide includes tin and gallium.

4. The display device of claim 3, wherein the metal oxide includes at least one selected from among the group consisting of indium tin gallium oxide, indium tin gallium zinc oxide, and tin aluminum gallium oxide.

5. The display device of claim 2, wherein the conductive oxide includes indium and tin.

6. The display device of claim 1, wherein the conductive oxide is crystalline.

7. The display device of claim 1, further comprising:
a gate insulation pattern between the active pattern and the gate electrode; and
a dielectric pattern between the first capacitor electrode and the second capacitor electrode and formed from a same layer as the gate insulation pattern.

8. The display device of claim 1, further comprising a connection line to transfer a constant voltage to the first capacitor electrode.

9. The display device of claim 8, wherein the connection line extends over the second capacitor electrode to form a third capacitor electrode overlapping the second capacitor electrode.

10. The display device of claim 1, wherein the second capacitor electrode is electrically connected to the gate electrode.

11. The display device of claim 1, wherein the second capacitor electrode and the gate electrode are in a same pattern.

12. The display device of claim 1, wherein the dummy semiconductor pattern comprises a same material as the active pattern comprises.

\* \* \* \* \*